(12) United States Patent
Kwak et al.

(10) Patent No.: US 7,423,372 B2
(45) Date of Patent: Sep. 9, 2008

(54) ORGANIC ELECTROLUMINESCENCE DISPLAY DEVICE HAVING ORGANIC PASSIVATION LAYER

(75) Inventors: Won-Kyu Kwak, Sungnam-si (KR); Byung-Hee Kim, Yongin-si (KR)

(73) Assignee: Samsung SDI Co., Ltd., Suwon (KR)

( * ) Notice: Subject to any disclaimer, the term of this patent is extended or adjusted under 35 U.S.C. 154(b) by 22 days.

(21) Appl. No.: 11/115,329

(22) Filed: Apr. 27, 2005

(65) Prior Publication Data

US 2005/0236979 A1 Oct. 27, 2005

(30) Foreign Application Priority Data

Apr. 27, 2004 (KR) .................. 10-2004-0029116

(51) Int. Cl.
*H01J 1/62* (2006.01)
(52) U.S. Cl. .................. 313/506; 313/505; 313/499; 313/494

(58) Field of Classification Search .................. 313/506, 313/505, 499, 494, 498, 491; 315/169.3, 315/169.4
See application file for complete search history.

(56) References Cited

U.S. PATENT DOCUMENTS

| 6,552,496 | B2* | 4/2003 | Yamazaki | 315/169.3 |
| 6,593,691 | B2* | 7/2003 | Nishi et al. | 313/506 |
| 2003/0214246 | A1* | 11/2003 | Yamazaki | 315/169.3 |

FOREIGN PATENT DOCUMENTS

KR  1020010070174 A1  7/2001

* cited by examiner

*Primary Examiner*—Tuyet Vo
(74) *Attorney, Agent, or Firm*—H.C. Park & Associates, PLC

(57) ABSTRACT

An organic electroluminescence display device comprising a wiring region, including a switching thin film transistor and a driving thin film transistor, and an emission region for emitting light. Light emitted from an organic thin film layer is emitted through the wiring region and the emission region.

12 Claims, 6 Drawing Sheets

ORGANIC ELECTROLUMINESCENCE DISPLAY DEVICE HAVING ORGANIC PASSIVATION LAYER

CROSS REFERENCE TO RELATED APPLICATION

This application claims priority to and the benefit of Korean Patent Application No. 10-2004-0029116, filed on Apr. 27, 2004, which is hereby incorporated by reference for all purposes as if fully set forth herein.

BACKGROUND OF THE INVENTION

1. Field of the invention

The present invention relates to an organic electroluminescence (EL) display device, more particularly, to an organic EL display device in which an opening ratio is improved by extending an emission region to between wirings.

2. Discussion of the Background

Various thin, light weight flat panel displays, including liquid crystal displays, field emission displays, plasma display panels, and organic EL display devices, are being developed to replace cathode ray tubes.

Organic EL display devices are receiving increasing attention since they may be driven by a low DC voltage and they have a fast response speed.

The organic EL display device may be a passive matrix or active matrix type display device. Generally, the active matrix type organic EL display device drives light-emitting elements by arranging a switching element at each pixel. FIG. 1 is a plan view showing a conventional active matrix type organic EL display device.

Referring to FIG. 1, a plurality of data lines 11 ($D_1 \ldots D_Z$), which transfer data signals, are connected to a data driver 10, and a plurality of scan lines 21 ($S_1 \ldots S_Y$), which transfer selection signals, are connected to a scan driver 20. A display panel 30 comprises a plurality of unit pixels 40 formed near crossings of the data lines 11 and the scan lines 21.

The data driver 10 and the scan driver 20 output data signals and selection signals to the unit pixels 40 through the data lines 11 and the scan lines 21, respectively, and applying a data signal to a unit pixel 40 lights that pixel so that the display panel 30 displays a certain image.

FIG. 2 is a cross-sectional view showing a unit pixel 40 in a conventional bottom-emission type organic EL display device.

As shown in FIG. 2, a conventional unit pixel 40 may comprise a buffer layer 43b formed on an insulating substrate 43a, a switching thin film transistor (TFT) 41 and a driving TFT 42 formed on the buffer layer 43b, and a passivation layer 44 formed on the switching and driving TFTs 41 and 42. An anode electrode 46 is formed on the passivation layer 44 and coupled to a drain electrode 42a of the driving TFT 42. A pixel defining layer 45 is formed on the passivation layer 44 and the anode electrode 46 with an opening part 50 exposing a part of the anode electrode 46. An organic thin film layer 47 is formed on an upper part of the pixel defining layer 45 and the exposed anode electrode 46, and a cathode electrode 48 is formed on an upper surface of the organic thin film layer 47.

A bump may be generated on the passivation layer 44 by a bump generated during formation of a TFT when using an organic layer as the passivation layer 44. Therefore, the anode electrode 46 may be formed on a flat part of the passivation layer 44 that is not above a TFT.

FIG. 3 is a plan view showing a unit pixel in a conventional organic EL display device.

Applying selection signals to the switching TFT 41, through the scan line 21, turns it on to transfer data signals from the data line 11 to a capacitor 51, so that the capacitor 51 may store the data signals and transfer the stored data signals to the driving TFT 42. The driving TFT 42 transfers driving current, corresponding to the data signals and applied through a power supply voltage line 52, to the anode electrode 46 so that the anode electrode 46, organic thin film layer 47 and cathode electrode 48 operate to emit light through the opening part 50.

However, the conventional bottom-emission type organic EL display device may have a small opening ratio because each unit pixel is divided into a wiring region comprising a plurality of wirings, the switching TFT, the driving TFT, and an emission region for emitting light. Hence, displayed images may not be smooth, and image quality may deteriorate as an emitting part and a dark part coexist in each pixel since a space between the wirings of the wiring region is dark even when the emission region is lit. A double-sided organic EL display device may also have deteriorated display quality because a luminance difference between the top and bottom of the device may increase.

SUMMARY OF THE INVENTION

The present invention provides an organic EL display device in which a passivation layer is formed of an organic layer capable of planarization, thereby permitting extension of an opening part to a space between wirings and increasing an emission area and an opening ratio.

Additional features of the invention will be set forth in the description which follows, and in part will be apparent from the description, or may be learned by practice of the invention.

The present invention discloses an organic EL display device comprising an insulating substrate having a wiring region, which includes a switching TFT and a driving TFT, and an emission region for emitting light. A passivation layer is formed on an upper part of the substrate, and a lower electrode is formed on the passivation layer and over the wiring region and the emission region. A pixel defining layer has an opening part exposing both a part of the wiring region and the emission region, an organic thin film layer is formed on the pixel defining layer and a portion of the lower electrode exposed by the opening part, and an upper electrode is formed on the organic thin film layer. Light emitted from the organic thin film layer is emitted through the wiring region and the emission region.

The present invention also discloses a pixel in an organic EL display device, comprising an emission region for emitting light, and a wiring region including a thin film transistor. Light emitted from an organic layer is emitted through the wiring region and the emission region.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
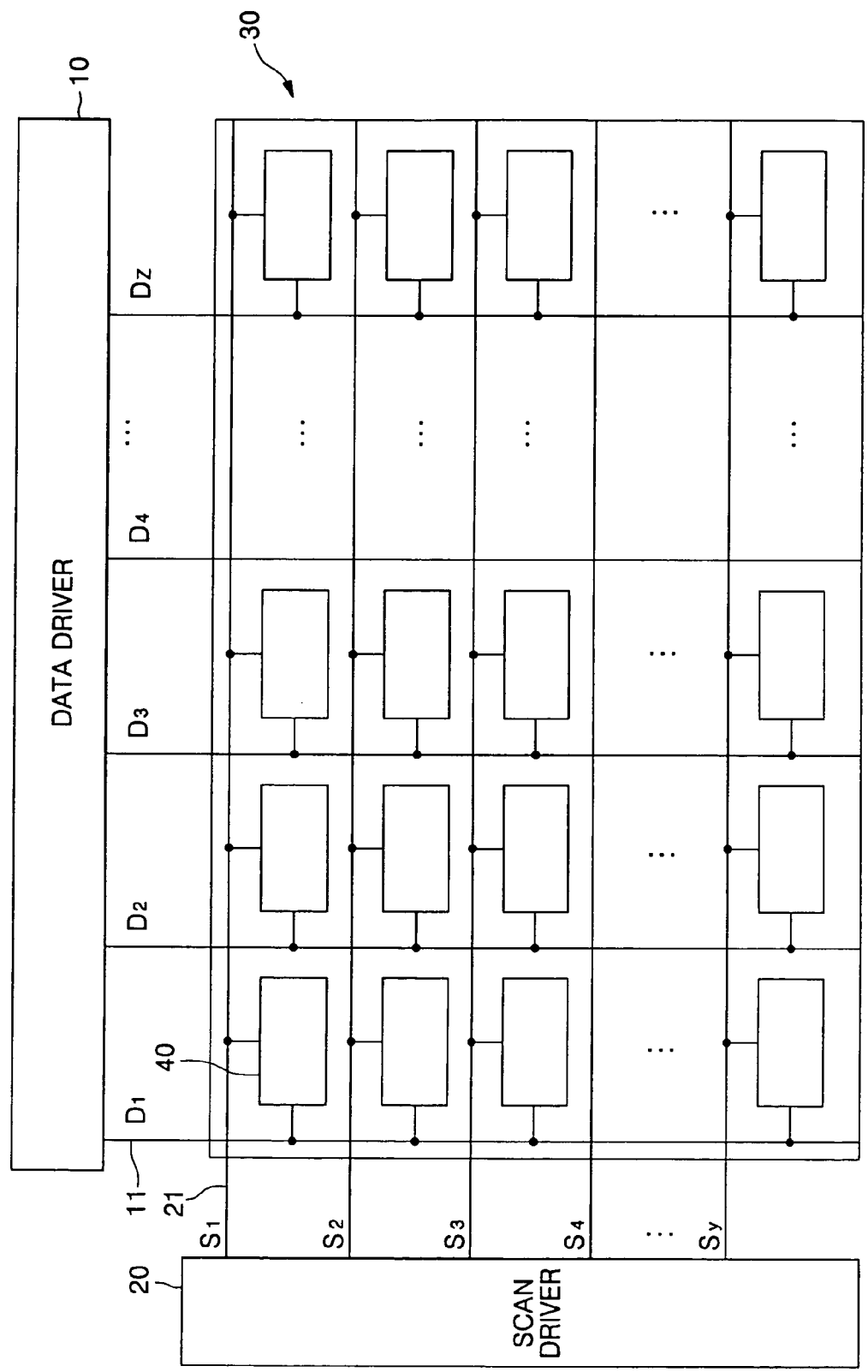
FIG. 1 is a plan view showing a conventional active matrix type organic EL display device.
Figure 2:
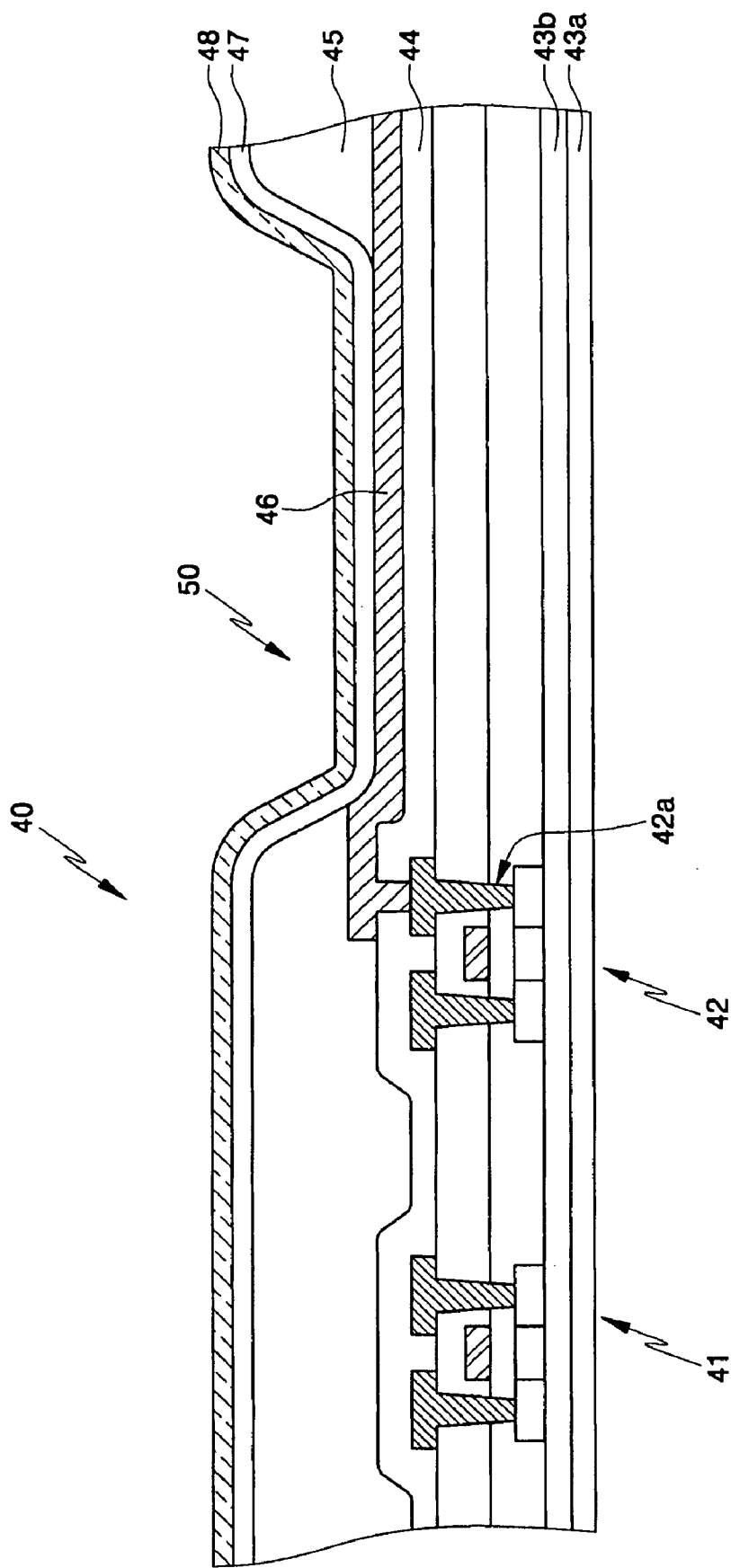
FIG. 2 is a cross-sectional view showing a conventional organic EL display device.
Figure 3:
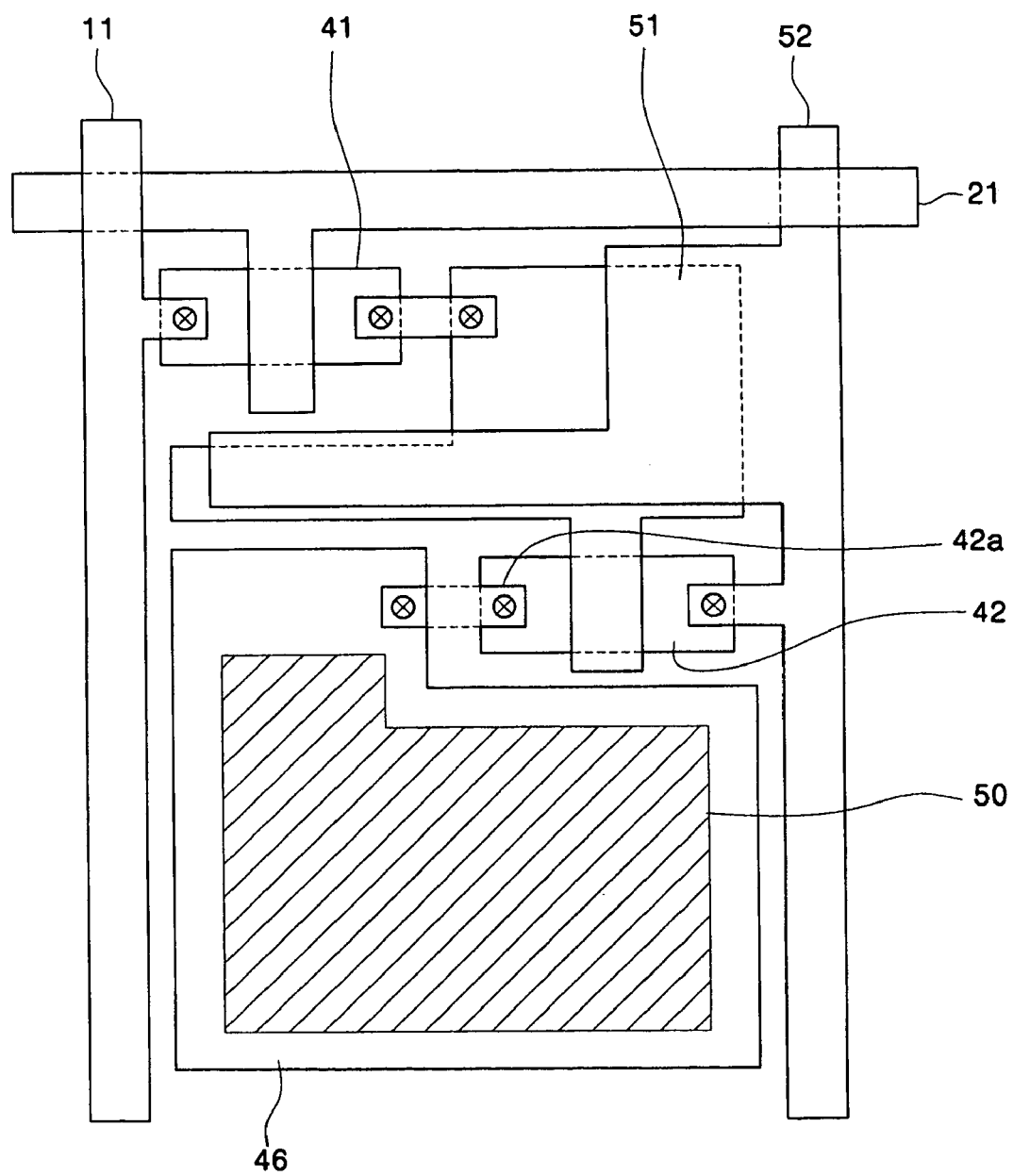
FIG. 3 is a plan view showing a conventional organic EL display device.

The present invention will now be described in detail with reference to the accompanying drawings. For reference, like reference characters designate corresponding parts throughout several views.

Figure 4:
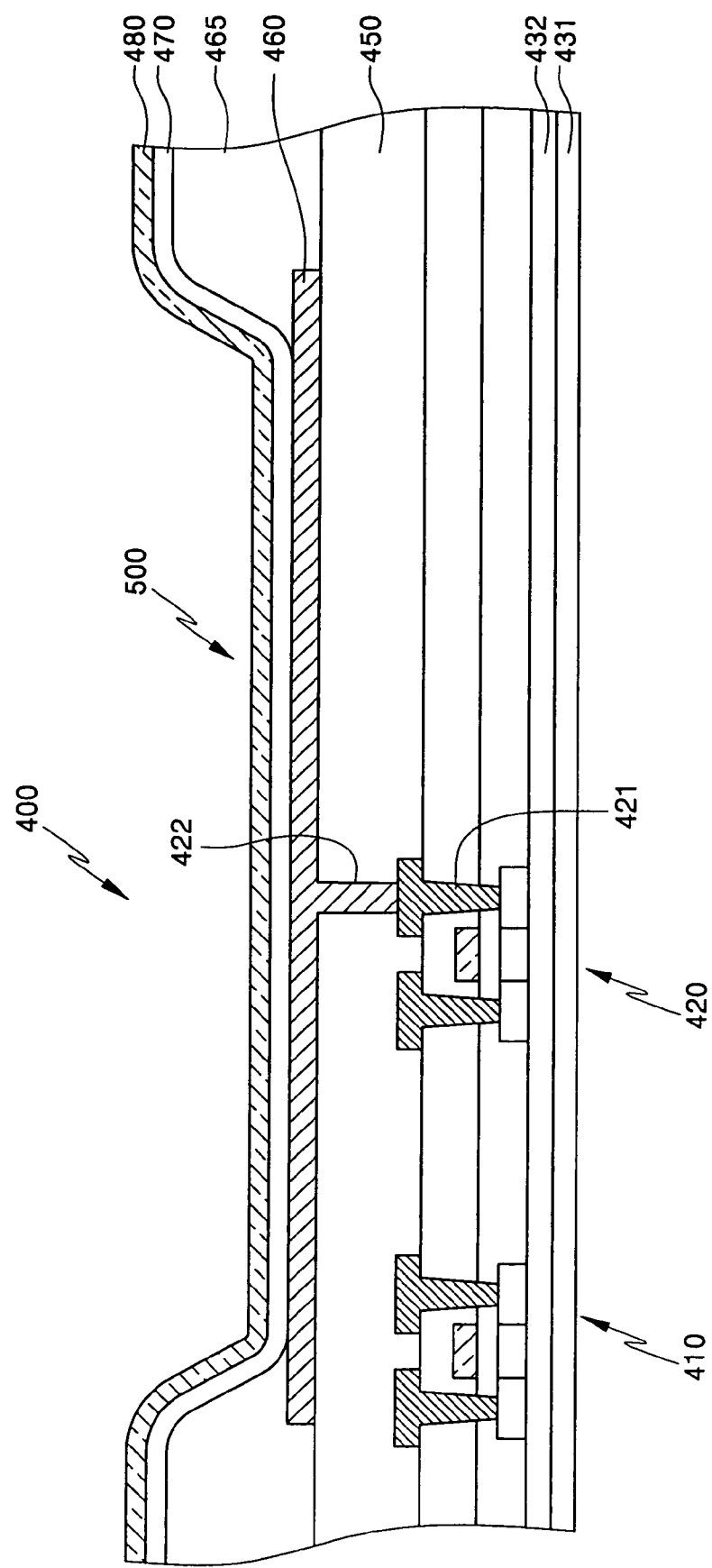
FIG. 4 is a cross-sectional view showing an organic EL display device according to an exemplary embodiment of the present invention.

FIG. 4 is a cross-sectional view showing an organic EL display device according to an exemplary embodiment of the present invention.

Referring to FIG. 4, in a unit pixel 400 according to an exemplary embodiment of the present invention, a substrate 431 and a buffer layer 432 may be formed, and a switching TFT 410 and a driving TFT 420 may be formed on an upper surface of the buffer layer 432. A passivation layer 450 may be formed on an upper part of the driving TFT 420 and the switching TFT 410, and an anode electrode 460 may be formed on an upper surface of the passivation layer 450. The anode electrode 460 may be coupled to a drain electrode 421 of the driving TFT 420 through a via hole 422. A pixel defining layer 465 may be formed having an opening part 500 exposing a part of the anode electrode 460, an organic thin film layer 470 may be formed on an upper surface of the pixel defining layer 465 and the exposed anode electrode 460, and a cathode electrode 480 may be formed on the organic thin film layer 470.

The passivation layer 450 may be formed of an organic layer having insulation characteristics and planarization characteristics so that the anode electrode 460 may extend to an upper part of a wiring region including the switching and driving TFTs 410, 420. The passivation layer 450 is preferably formed of any one material of BCB or acryl.

The anode electrode 460 may be formed over a wiring region in which the switching TFT 410, the driving TFT 420 and other wirings are formed, and an emission region. The organic thin film layer 470 may be formed on the anode electrode 460 in the opening part 500 exposing the wiring region and the emission region, and anode electrodes 460 of adjacent pixels may be formed so that they are electrically insulated from each other.

The organic thin film layer 470 may comprise one or more thin film layers, including a hole transport layer, a hole injection layer, an emitting layer, a hole blocking layer, an electron transport layer and an electron injection layer. A stripe type organic thin film layer 470 may provide a superior opening ratio as compared to a dot type organic thin film layer 470.

Figure 5:
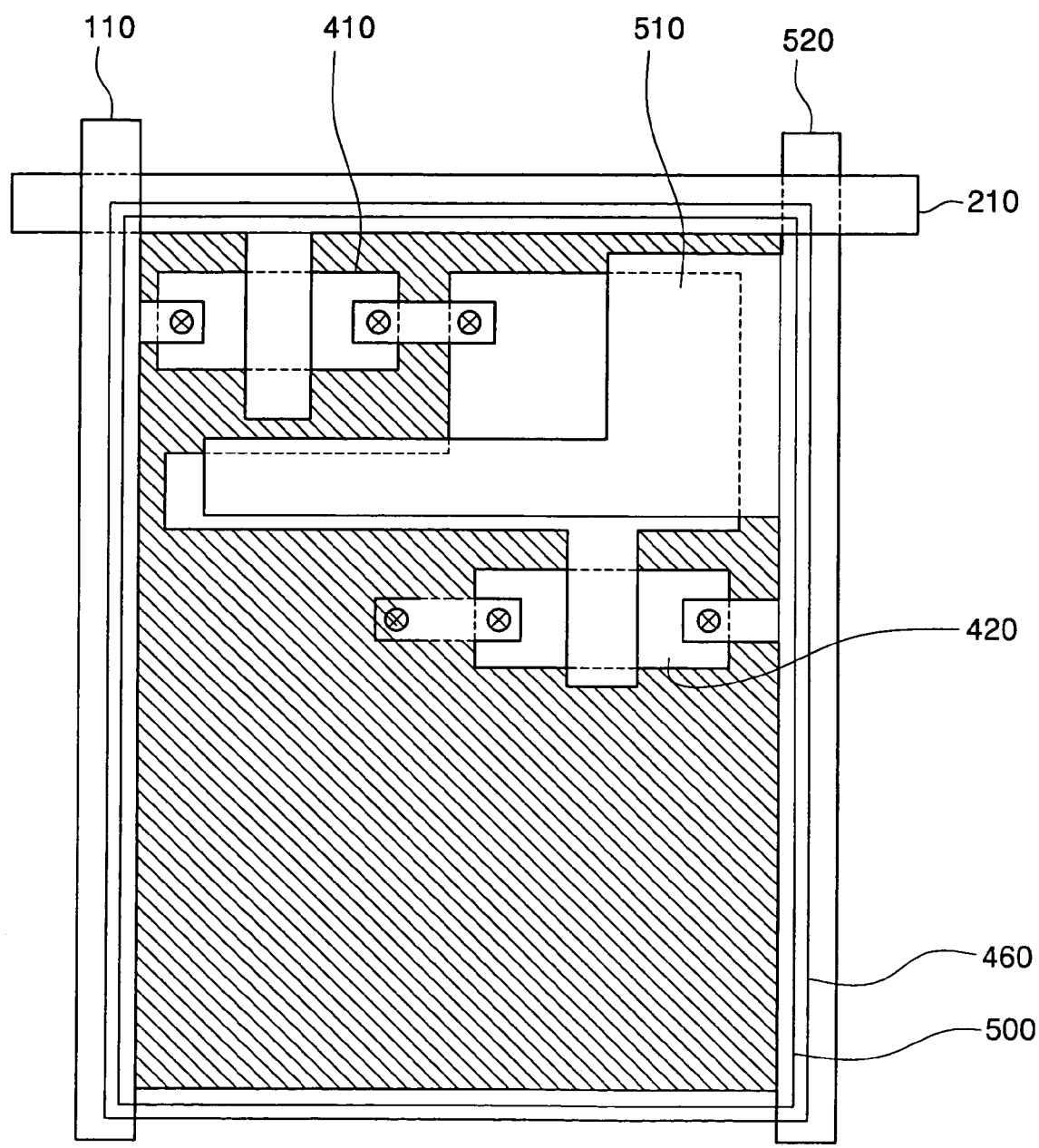
FIG. 5 is a plan view showing an organic EL display device according to an exemplary embodiment of the present invention.
Figure 6:
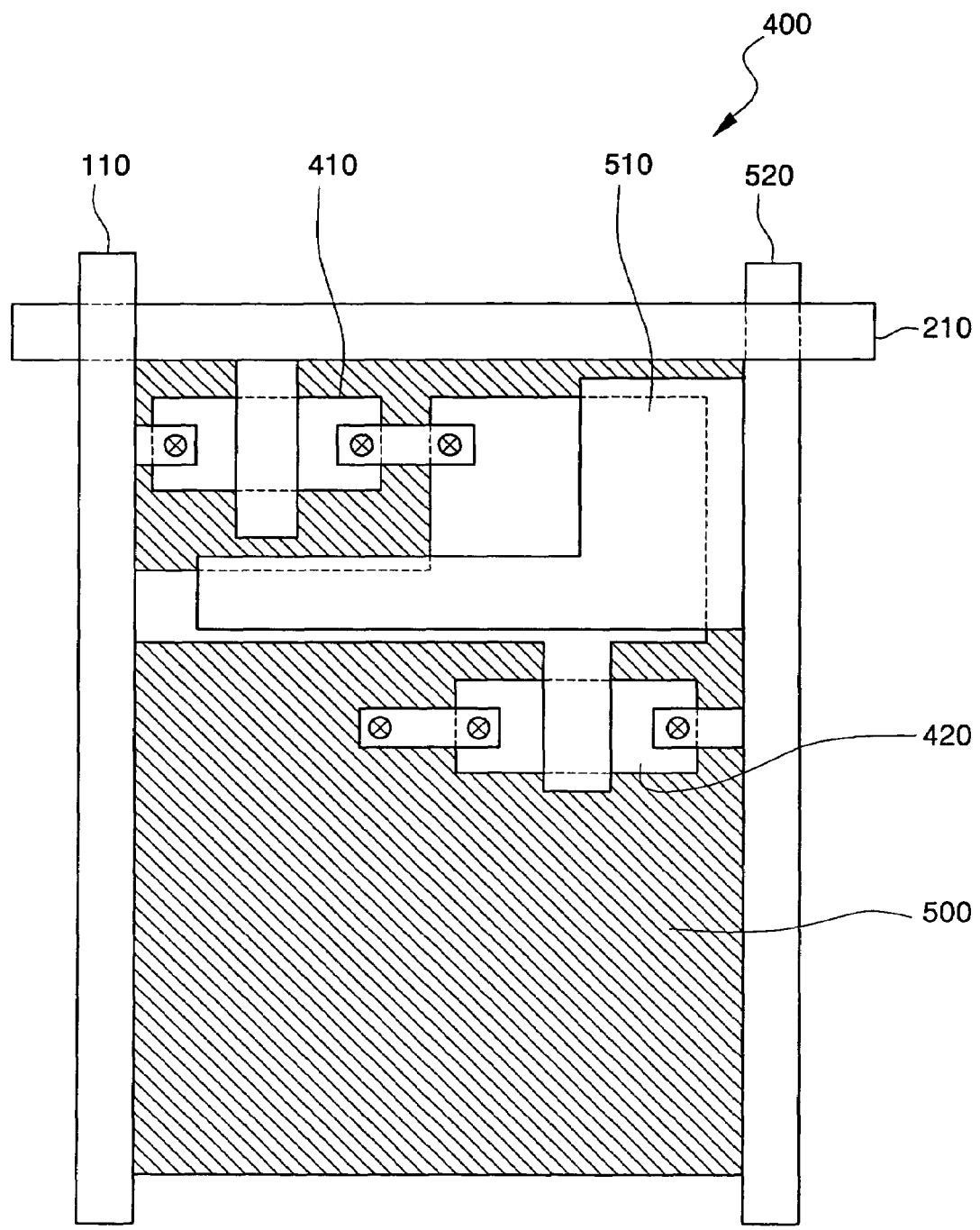
FIG. 6 is a plan view showing a visible emission area in an organic EL display device according to an exemplary embodiment of the present invention.

FIG. 5 shows a lit emission area of an opening part of the bottom of the organic EL display device according to an exemplary embodiment of the present invention. FIG. 6 shows an emission area of the opening part that may be visible to the human eye.

As described above and referring to FIG. 5 and FIG. 6, light is emitted in an emission area (oblique lined part), including the wiring region and the emission region, when the opening part 500 is formed in such a way that it extends to the wiring region in which the switching TFT 410, the driving TFT 420 and their respective wirings are formed.

Applying selection signals to the switching TFT 410 through the scan line 210 turns on the switching TFT 410, and it transmits data signals applied through the data line 110 to the driving TFT 420 and a capacitor 510. The data signals are stored in the capacitor 510 to be transmitted to the driving TFT 420, and the driving TFT 420 transmits an electric potential formed by a power supply voltage, applied through a power supply voltage line 520, to the anode electrode 460, correspondingly to the data signals.

Since light is emitted in the wiring region and in the emission region, a user may see that light is emitted in an area such as that shown in FIG. 6.

Therefore, in a bottom-emission type organic EL display device according to exemplary embodiments of the present invention, an emission area may increase. For example, a conventional emission area of 4,599 $\mu m^2$ may be increased to 8,026 $\mu m^2$, which is a 74.5% increase. Additionally, forming the passivation layer using an organic layer capable of planarization may extend the opening part to the wiring region, thereby increasing the opening ratio. For example, the opening ratio may increase as much as 11.1%, from a conventional opening ratio of 35.1% to 46.2%, by forming the passivation layer using an organic layer capable of planarization.

Furthermore, applying the foregoing bottom-emission structure to a double sided emission type organic EL display device may improve its display quality by reducing a luminance difference between the top and bottom of the device.

As described above, forming a passivation layer using an organic layer capable of planarization allows extension of the layer's opening area to a wiring region, which increases an organic EL display device's opening ratio and emission area. Additionally, exposing the opening part between wirings reduces a space displayed as a dark part between the wirings, which helps to display smooth, quality images.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A pixel in an organic EL display device, comprising:
   a substrate;
   an emission region for emitting light; and
   a wiring region including a switching thin film transistor and a driving thin film transistor, the switching thin film transistor and the driving thin film transistor being arranged between the substrate and an organic light emitting layer,
   wherein light emitted from the organic light emitting layer is emitted to the substrate through the wiring region and the emission region.

2. The pixel of claim 1, wherein the planarized passivation layer is formed of benzocyclobutene (BCB) or acryl resin.

3. The pixel of claim 1, further comprising:
   a planarized passivation layer formed over the switching and driving thin film transistors and having a via hole coupling a first pixel electrode to a source or drain electrode of the driving thin film transistor.

4. The pixel of claim 3, further comprising:
a pixel defining layer having an opening in the wiring region and the emitting region and exposing a portion of the first pixel electrode,
wherein the first pixel electrode is formed in the wiring region and the emitting region,
wherein the organic layer is formed on the pixel defining layer and the portion of the first pixel electrode exposed by the opening.

5. The pixel of claim 3, wherein the planarized passivation layer is directly on the switching thin film transistor and the driving thin film transistor.

6. The pixel of claim 5, wherein the first pixel electrode is directly on the planarized passivation layer.

7. An organic electroluminescence (EL) display device, comprising:
an insulating substrate including:
a wiring region having a switching thin film transistor and a driving thin film transistor; and
an emission region for emitting light;
a passivation layer formed on an upper part of the insulating substrate;
a lower electrode formed on the passivation layer and in the wiring region and the emission region;
a pixel defining layer comprising an opening part exposing a part of the wiring region and the emission region;
an organic thin film layer formed on the pixel defining layer and a portion of the lower electrode exposed by the opening part; and
an upper electrode formed on the organic thin film layer,
wherein light emitted from the organic thin film layer is emitted to the insulating substrate through the wiring region and the emission region.

8. The organic EL display device of claim 7, wherein the passivation layer is formed of an insulating organic material capable of planarization.

9. The organic EL display device of claim 8, wherein the passivation layer is directly on the switching thin film transistor and the driving thin film transistor.

10. The organic EL display device of claim 9, wherein the lower electrode is directly on the passivation layer.

11. The organic EL display device of claim 8, wherein the passivation layer is formed of benzocyclobutene (BCB) or acryl resin.

12. The organic EL display device of claim 8, wherein the organic thin film layer is formed in a stripe shape.

\* \* \* \* \*